United States Patent [19]

Jacomini

[11] Patent Number: 4,829,307

[45] Date of Patent: May 9, 1989

[54] RECURSIVE RADAR CLUTTER FILTER

[75] Inventor: Omar J. Jacomini, Severna Park, Md.

[73] Assignee: Westinghouse Electric Corp., Pittsburgh, Pa.

[21] Appl. No.: 727,173

[22] Filed: Apr. 25, 1985

[51] Int. Cl.$^4$ .............................................. G01S 13/50
[52] U.S. Cl. ................................................... 342/159
[58] Field of Search .......................... 343/17.1 R, 7.7; 333/166, 143; 342/159

[56] References Cited

U.S. PATENT DOCUMENTS

| | | | |
|---|---|---|---|
| 3,599,108 | 8/1971 | Gardner | 333/166 |
| 3,775,768 | 11/1973 | Lisle et al. | 343/17.1 R X |
| 3,783,258 | 1/1974 | Chwastyk . | |
| 3,787,851 | 1/1974 | Hughes | 343/7.7 |
| 3,787,852 | 1/1974 | Puckette et al. | 343/7.7 |
| 3,852,742 | 12/1974 | Fletcher, Jr. et al. | 343/7.7 |
| 3,879,729 | 4/1975 | Nevin | 343/7.7 X |
| 3,895,304 | 7/1975 | Klein . | |
| 4,075,703 | 2/1978 | Dillard . | |
| 4,144,571 | 3/1979 | Webber . | |
| 4,345,252 | 4/1981 | Carre et al. . | |
| 4,521,867 | 6/1985 | Kasuga | 353/166 X |

Primary Examiner—Nelson Moskowitz
Assistant Examiner—Mark Hellner
Attorney, Agent, or Firm—W. G. Sutcliff

[57] ABSTRACT

A recursive radar filter arranged to provide filtering of ground clutter signals from radar echoes in the form of short batches of pulses. The filter includes a feed-forward section with delay, adder, and fixed amplifier elements. The filter also includes a feedback section which includes similar elements. Two time-varying amplifiers are included in the filter which change gain as the pulses are applied to the input of the filter. In a three delay version of the filter, the gain of one of the time-varying amplifiers is such that the feed-forward section of the filter does not pass any pulses until the fourth pulse has been applied to the filter. After the third pulse, the gain of this time-varying amplifier increases on each successive input pulse. In another embodiment, the two time-varying amplifiers are eliminated by making all of the fixed gain amplifiers time-varying in relationship with the interpulse period of the pulse input signal. Both arrangements allow recursive filtering without the need for extra pulses or pulse tapering to control transients in the filter.

15 Claims, 5 Drawing Sheets

| AMPLIFIER NUMBER | FIXED GAIN |
|---|---|
| 36 | .1840823 |
| 42 | -.5510675 |
| 66 | .5510675 |
| 68 | -.1840823 |
| 54 | 2.3603824 |
| 70 | -1.9401033 |
| 72 | .3604460 |

FIG. 2A

| PULSE NUMBER | AMPLIFIER 44 GAIN | AMPLIFIER 50 GAIN |
|---|---|---|
| 1 | .0000000 | .0000000 |
| 2 | .0000000 | .0000000 |
| 3 | .0000000 | .0000000 |
| 4 | .0246733 | 10.1354527 |
| 5 | .0986636 | 4.5064911 |
| 6 | .2219021 | 2.5363726 |
| 7 | .3942639 | 1.6244792 |
| 8 | .6155819 | 1.1291288 |
| 9 | .8856386 | .8304525 |
| 10 | 1.2041629 | .6366014 |
| 11 | 1.5708416 | .5036985 |
| 12 | 1.9853144 | .4086348 |
| 13 | 2.4471731 | .3382994 |
| 14 | 2.9559612 | .2848049 |
| 15 | 3.5111756 | .2431746 |
| 16 | 4.1122703 | .2101438 |
| 17 | 4.7586469 | .1834972 |
| 18 | 5.4496736 | .1616902 |

FIG. 2B

RECURSIVE RADAR CLUTTER FILTER

BACKGROUND OF THE INVENTION

This invention relates, in general, to electrical signal filters which appropriately pass or reject a repetitive string of electrical pulses and, more specifically, to recursive radar filters suitable for filtering the clutter spectrum out of pulse-doppler radar echoes.

In pulse-doppler radar systems, it is necessary to utilize a filtering arrangement at the radar receiver to selectively pass or reject desirable and undesirable characteristics of the detected echo signal. Received pulses centered around the original transmitted frequency with relatively small frequency change are characteristic of unwanted echoes, or clutter. Consequently, it is desirable to filter out the clutter and preserve the other information contained in the echo pulses, such as the frequency shifted pulses returned from moving targets.

Various types of filters have been used in the past. Many of these filter arrangements used delay lines in order to help cancel out the clutter pulses. Because of the relatively long delay required, acoustical and optical delay devices were frequently used in the prior art. Advances in technology eventually permitted the use of analog electrical circuits and, most recently, radar clutter filters have been implemented using digital processing techniques.

In certain applications, it has been found advantageous to utilize a batch of pulses rather than process a continuous stream of pulses. When using such a batch of pulses, it is highly desirable to integrate as many of the returned pulses as possible in order to maintain a high sensitivity.

Unfortunately, prior art clutter filters with desirable filtering characteristics have required multiple delay circuits and recursive feedback to achieve the desired filtering. This arrangement of delay and feedback has made these filter devices susceptible to undesirable transient response and a ringing condition occurs frequently when large clutter signals are applied to the filter input. This condition can also occur when the repetition rate of the radar pulses changes. The transient response can swamp or mask the desired target echo until the transients have settled down.

One successful method for limiting the detrimental effects of transient response in recursive clutter filters employs the tapering of the input pulses. Although helpful for limiting transient response, the efficiency of the system is degraded because the extra pulses can only be used for transient dampening and not for target processing. Another method blocks or ignores some of the first pulses from the recursive filter until the filter is operating more in a steady state condition. Because of these inefficient methods of making recursive clutter filters usable, many radar systems have simply used feed-forward, non-recursive filters when short batches of pulses need to be filtered. Although feed-forward filters do not tend to have transient problems, the velocity response or filtering action of the filter is not as good as a recursive clutter filter.

Further background on recursive clutter filters can be found in Chapter 4 of "Introduction to Radar Systems" by Merrill I. Skolnik, published by McGraw Hill, Inc., (1970).

U.S. Pat. No. 4,345,252, entitled "Non-Linear Dynamic Filtering Device for the Angular Measuring of Noise in a Radar," describes a radar filter for use in enhancing the angular measurements of radar or sonar systems. While the device in the referenced patent employs the use of delay circuits and variable gain amplifiers, there are distinctive differences between the teachings in the referenced patent and the invention disclosed herein. In the referenced patent, the input signals are not in the form of repetitive pulses but are sinusoidal in nature. The variable gain is dependent upon the value of the analog input of one of the quantities used to determine the angular deviation of the system. In the invention disclosed herein, the gain of the amplifier circuits, as will be described later in detail, is determined by a time varying formula, that is, the period between successive pulses.

In view of the background and of the prior art, it is desirable and it is an object of this invention, to provide a radar clutter filter which exhibits excellent pass and reject characteristics on relatively short batches of pulses.

SUMMARY OF THE INVENTION

There are disclosed herein new and useful arrangements for filtering the clutter echoes in pulse-doppler radar receivers. According to one embodiment of the invention, the filter includes a feed-forward section having fixed gain amplifiers and delay circuits, two adders and an amplifier having a time varying gain interconnected between the adders, a feedback section having fixed gain amplifiers and delay circuits, and an amplifier having a time varying gain which is connected at the output of the second adder. According to a three delay version of this embodiment, the input pulses are delayed and weighted by the fixed amplifiers before being added together, with two of the fixed amplifiers having inverted outputs. The gain of the first time varying amplifier is maintained at zero until the fourth pulse has been applied to the filter, then the gain starts increasing on each successive pulse. The gain of the second time varying amplifier decreases after it starts to receive pulses from the feed-forward section of the filter.

Another embodiment of the invention includes elements similar to the previously described embodiment except that instead of varying the gain of the two separate amplifiers, they are eliminated and the gain of the other amplifiers is changed from fixed to time varying to give the same results. Both embodiments permit the use of recursive filters with their excellent response characteristics on short batches of pulses without the need to taper the input pulses to prevent undesirable transient response.

DESCRIPTION OF THE DRAWINGS

Further advantages and uses of this invention will become more apparent when considered in view of the following detailed description and drawing, in which:

FIG. 2A is a table indicating fixed amplifier gains for the indicated amplifiers;

FIG. 2B is a table indicating time varying amplifier gains for two amplifiers;

DESCRIPTION OF THE PREFERRED EMBODIMENTS

Figure 1:
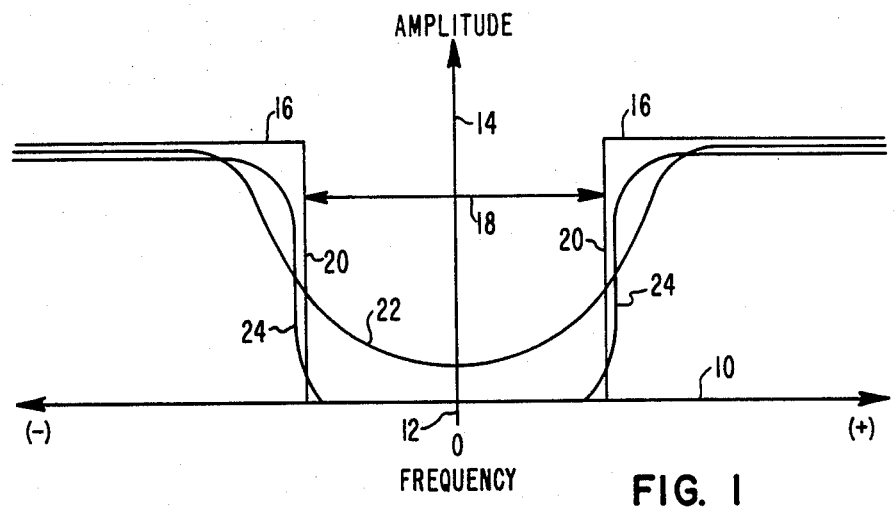
FIG. 1 is a graph depicting the filtering characteristics of various clutter filters.

Throughout the following description, similar reference characters refer to similar elements or members in all of the figures of the drawing.

Referring now to the drawing, and to FIG. 1 in particular, there is shown a graph of the filtering characteristics of various clutter filters. The horizontal axis corresponds to the frequency of the signal, with the frequency increasing to the right of the center frequency location 12, and decreasing to the left of the center frequency. The vertical or reference frequency axis 14 corresponds to the amplitude of the signals passed by the filter.

Curve 16, which is shown to be symmetrical around the center frequency, illustrates what normally is considered the ideal response for a clutter filter in doppler radar systems. Such an ideal filter would have a notch width 18 large enough to filter out all of the ground clutter radar echoes which are concentrated within a narrow portion of the spectrum around the reference frequency axis 14. In addition, an ideal filter would have steep notch faces 20 which permit the filter to pass, without distortion or attenuation, all of the doppler shifted echoes with frequencies outside the notch region.

Such an ideal filter is desirable, but only filters approaching the ideal characteristics are achievable. Filter response curve 22 illustrates the actual limited success of many prior art arrangements in achieving the desired ideal response. Although satisfactory in many applications, its departure from the ideal curve limits the performance of the radar system. Filter response curve 24 illustrates a much improved filter response and one which approaches the ideal response. Curve 24 is typical of the filter response provided by a filter constructed according to the present invention, and it illustrates the direction of improvement the present invention provides over previous filters.

Figure 2:
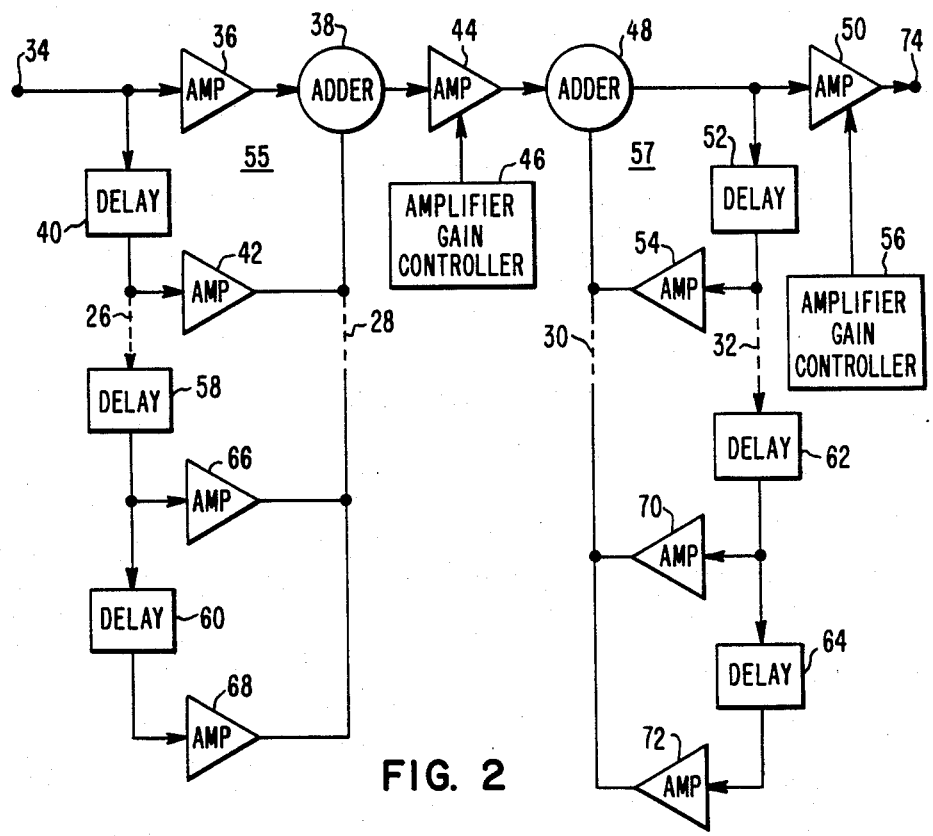
FIG. 2 is a block diagram of one embodiment of the invention.

FIG. 2 is a block diagram of one embodiment of the invention. The blocks are illustrative of various processing functions and are interconnected together in a manner which is new and useful in providing desirable filtering characteristics without wasting excessive pulse energy. The dashed lines 26, 28, 30 and 32 indicate that portions of the circuit are either connected together or isolated from each other in various embodiments of the described invention.

Referring again to FIG. 2, the circuit block diagram includes an input terminal, node or path 34 to which the input signal pulses are applied or connected. The input pulses are then processed by the fixed gain amplifier 36 and applied to the adder 38. Although amplifier 36 and similar block elements to be identified later herein are termed "amplifiers," it should be understood that they may or may not amplify or increase the magnitude of the signal. In some cases, the amplification factor, or gain, will be less than unity or, in some cases, equal to zero. In addition, some of the amplifiers may have a negative gain or a positive gain which has been inverted. The term "conditioned" will be used later herein to include all of these amplification possibilities.

The input signal applied to the terminal 34 also goes through a delay circuit 40 which produces an output after the delay period has transpired. Unless otherwise noted, the delay times of the delay circuits shown in the drawings are equal to the interpulse period of the pulse batch or train applied to the filter. The pulse output from the delay circuit 40 is applied to the amplifier 42 whose output is applied to the adder 38.

The amplifiers 36 and 42, the adder 38, and the delay circuit 40 form a two-pulse, feed-forward circuit which processes the input signal and applies the processed signal to the time varying amplifier 44. During operation, the first pulse of the signal applied to terminal 34 is applied to the adder 38. Since the first pulse has not yet propagated through the delay circuit 40, the output of amplifier 42 which is applied to adder 38 is zero during the first input pulse. Thus, the output of the adder 38 during the first pulse is directly proportional to the first input pulse signal modified in amplitude by the amplifier 36.

When the second pulse of the input signal is present at the input terminal 34, the first pulse has propagated through the delay circuit 40 and has been applied to the amplifier 42. Therefore, both amplifiers 36 and 42 have outputs which are added together by the adder 38. The amount of gain of the amplifiers 36 and 42 is dependent upon the desired overall response of the circuit, with the gain of all the circuit amplifiers being capable of determination by those skilled in the art by computer analysis of the circuit based upon a desired filtering characteristic.

The gain of the amplifier 44 is controlled by the amplifier gain controller 46 which varies the gain according to a predetermined pattern based upon the amount of time elapsed after the first pulse was applied. In other words, the gain of the amplifier 44 is time varying and may change with the application of successive pulses to the input terminal 34. For the circuit of FIG. 2 to give the desired performance, it has been found that the gain of the amplifier 44 should be approximately zero until the delay amplifier 42 has been loaded with the delayed first pulse. Thus, the gain controller 46 is designed to make the gain of the amplifier 44 zero for the first pulse and increase the gain on successive pulses. Effectively, this type of gain control blocks the output of the pulse signal until such time as the delayed pulse is available to influence the output signal.

The output of the amplifier 44 is applied to the adder 48 which has its output applied to the gain controlled amplifier 50. As can be seen in FIG. 2, the delay circuit 52 and the amplifier 54 are connected in the circuit to reapply, after the delay period of circuit 52, the output of adder 48 to its input. The gain of the amplifier 50 is controlled by the amplifier gain controller 56 whose gain, as stated previously, is selected by computer analysis to give the desired filter response.

While the single delay arrangement described thus far may give satisfactory filter performance in some applications, many radar pulse signals will need additional cascaded delay circuits connected in the overall filter circuit to yield the desired response. Accordingly, the dashed lines 26, 28, 30 and 32 shown in FIG. 2 indicate that two more cascaded delay sections may be added to the basic filter circuit. Therefore, delay circuits 58, 60, 62 and 64 and amplifiers 66, 68, 70 and 72 are used in a preferred embodiment of the invention.

As can be seen from FIG. 2, the input pulses are delayed a total of three times in the feed-forward portion 55 of the circuit, that is, the portion of the circuit from the input terminal 34 to the amplifier 44. The pulses in the feedback portion 57 of the circuit, that is, the portion of the circuit from the amplifier 44 to the output terminal 74, are delayed a total of three times. The extra delays and the associated gain changes permit the designer to achieve better filtering response with the proper selection of fixed and controlled amplifier gains.

FIG. 2A is a table which indicates the fixed gain of the amplifiers 36, 42, 66, 68, 54, 70 and 72. FIG. 2B is a table which indicates the change in gain of the amplifiers 44 and 50 with respect to each successive pulse of an eighteen pulse radar echo signal. Although these values were determined by computer analysis of the circuit shown in FIG. 2 for a particular filter response with an eighteen pulse signal, they are illustrative of the gains used for other variables of the desired performance.

According to FIGS. 2A and 2B, an eighteen pulse signal applied to the three delay circuit of FIG. 2 would start providing an output at terminal 74 on the fourth pulse when both amplifiers 44 and 50 have a gain other than zero. Each input pulse is delayed up to three times the interpulse period and the amplitude of the delayed pulse is determined by the fixed gain amplifiers 42, 66 and 68 before being applied to the adder 38. The adder 38 effectively takes the delayed and weighted pulse signals and combines them with the current weighted pulse signal from amplifier 36. Because of the negative gain values associated with amplifiers 42 and 68, summation by the adder 38 of the delayed signals has a cancelling effect upon the signal and is instrumental in providing the notch characteristics of the filter circuit.

Referring to both FIGS. 2 and 2B, it can be seen that amplifier 44 does not pass any pulses until the fourth pulse and then the amplitude of the pulse is relatively small. As each successive pulse is passed by the amplifier 44, it is amplified more each time. At the same time, the gain of amplifier 50 becomes non-zero on the fourth pulse and decreases from a relatively high value on the fourth pulse to its lowest value on the eighteenth pulse.

The feed-forward portion 55 of the circuit of FIG. 2 has a relatively short transient response and works well when operating on a short batch of pulses without any tapering of the input pulses. After passing through the feed-forward portion 55 of the circuit, the notch characteristics of the filter are fairly well established. Virtually all of the ground clutter will be eliminated before the pulse signal enters the feedback portion 57 of the filter. The feedback portion 57 of the circuit is used to "fine tune" the filter response and, in radar systems, is used to make the response such that low velocity targets and high velocity targets are equally visible. Contrary to prior art techniques, great care in controlling the transients in the feedback portion 57 of this circuit is not needed because the contamination from the ground clutter has already been eliminated by the feed-forward portion 55 of the filter circuit.

Once all of the delay circuits have been loaded with pulses, the filter will output a pulse for every input pulse. These outputs, however, have different velocity responses from pulse to pulse. To achieve the overall filter response, the pulses are non-coherently integrated to give the composite response for which the filter parameters have been selected.

In determining the arrangement and magnitude of the gain variation of the amplifier 50, two characteristics are important. Namely, the shape of the composite frequency response and the system sensitivity. The system sensitivity can best be calculated by computing the number of decorrelated variates out of the filter. The more decorrelated variates in the output, the greater will be the sensitivity of the non-coherent addition of the output pulses. An eighteen pulse filter arranged according to the present invention with the amplifier gains shown in FIGS. 2A and 2B exhibited excellent frequency response with 12.91 independent variants of data in the combined output.

Figure 3:
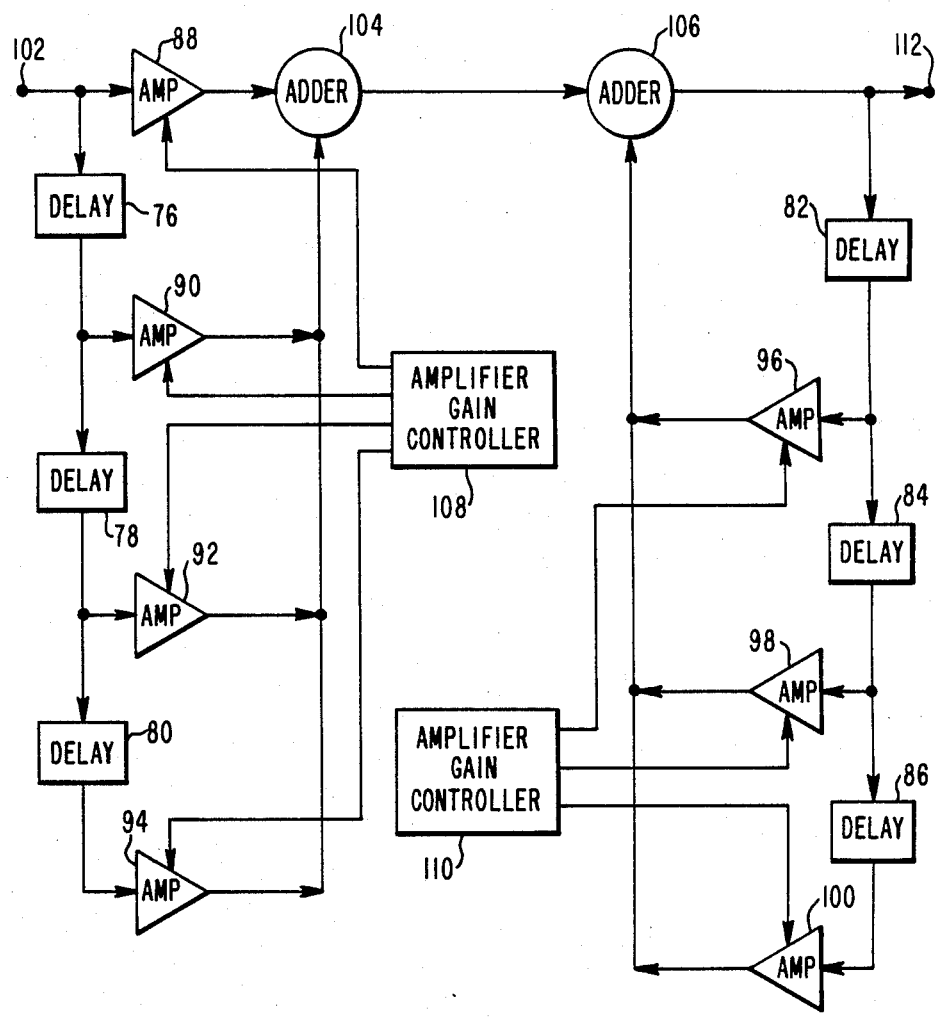
FIG. 3 is a block diagram of another embodiment of the invention.

The filter circuit shown in FIG. 2 uses both fixed and time-varying amplifiers. FIG. 3 is a block diagram of a filter circuit which gives the same filter response as the circuit of FIG. 2 without the two time-varying amplifiers by making amplifiers that were fixed according to FIG. 2 time-varying according to FIG. 3. It can be shown mathematically that, by changing the gain of each delay associated amplifier, there is no need for a common time-varying amplifier. Accordingly, FIG. 3 includes the delay circuits 76, 78, 80, 82, 84 and 86, and the time-varying amplifiers 88, 90, 92, 94, 96, 98 and 100. The input terminal 102, the adders 104 and 106, the amplifier gain controllers 108 and 110, and the output terminal 112 complete the circuit.

The circuit of FIG. 3 functions basically the same as the circuit of FIG. 2 when the gain of each amplifier is changed with each pulse in a manner equivalent to the combined gains of the respective fixed and variable amplifiers in FIG. 2. Although the circuit of FIG. 3 uses more time-varying amplifiers than the circuit of FIG. 2, it is still considered the more economical circuit because it can deliver the same response with fewer amplifiers.

FIGS. 2 and 3 show filter circuits in terms of analog components for the purpose of describing the invention. In actual practice, analog circuits or elements could be used, but the preferable way in current state-of-the-art practice is to use digital processing to provide the functions shown in the filter circuits. Various digital processing technologies can be used including microprocessor controlled processing, hard wired logic systems, and systolic arrays, with the latter two examples being desired because of the speed constraints in using a single microprocessor to manipulate the filter data. A description follows indicating how digital processing may be used to perform the delay, gain and adding functions of the filter circuit. Although the description outlines a specific method of processing the digital signals, various other methods and arrangements may be used without departing from the concepts taught by this invention.

In digitally processing the radar signals, the first step which must be accomplished is converting the analog signal information to digital values. This is accomplished by an analog-to-digital converter to which the input signal is applied. Normally, the I (in-phase) and Q (quadrature) signals are applied to separate filter circuits and each component is filtered separately.

The batch of pulses to be filtered are grouped into a sequence of pulses with the time required to contain these pulses being known as a coherent processing interval (CPI). In the description of the circuits of FIGS. 2 and 3, an eighteen pulse CPI was used for illustrative purposes. For a portion of the time between successively transmitted pulses, the receiving system of the radar is providing digital samples of the received signal to the filter. The rate at which the samples are available is dependent upon the sampling rate of the A/D converter. The time between pulses is known as the interpulse period. It is during the interpulse periods that the A/D samples are processed for each transmitted pulse, and such periods are referred to herein as processing intervals.

Figure 4:
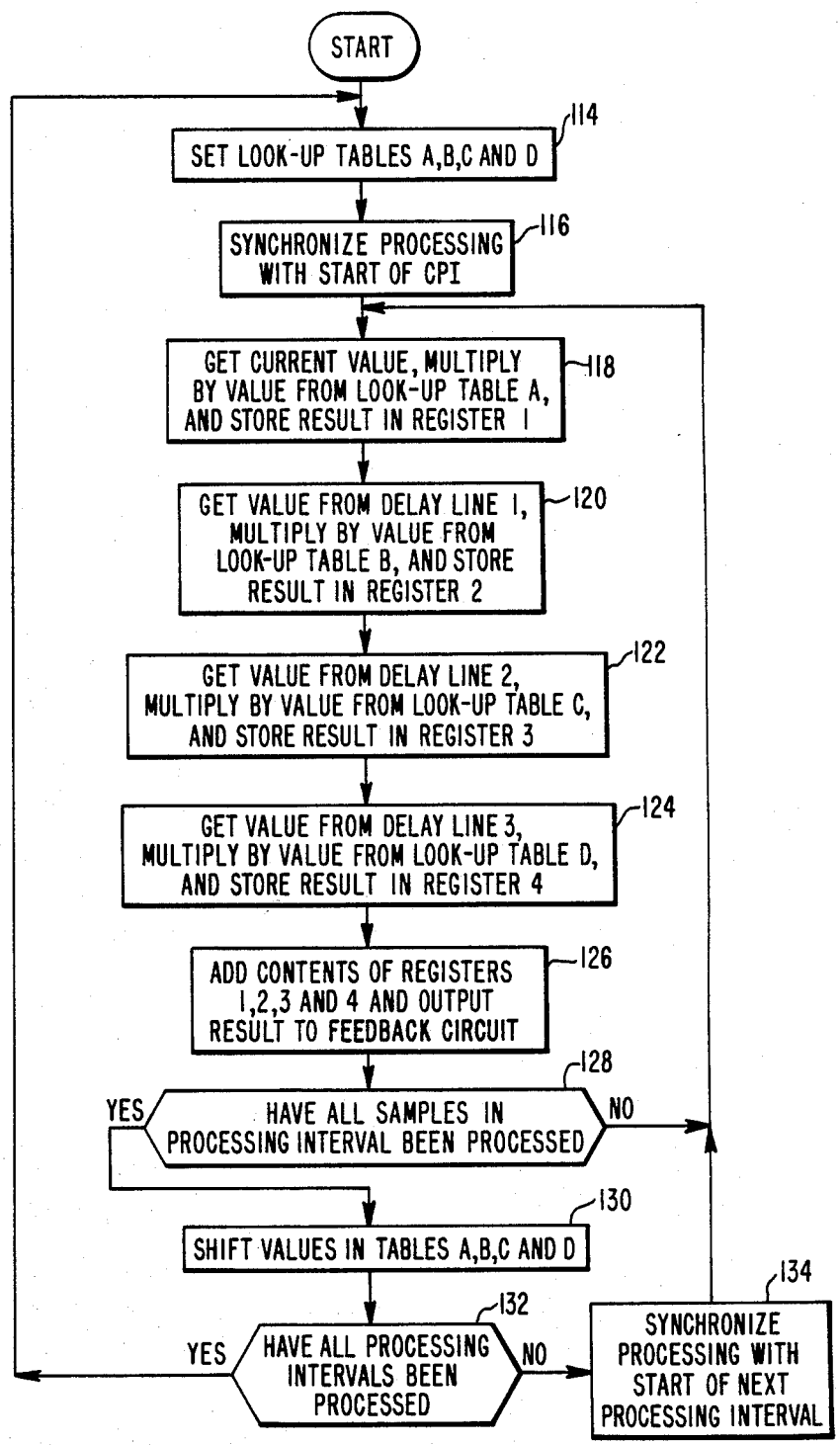
FIG. 4 is a flow chart of a procedure which may be used to perform the feed-forward portion of the circuit shown in FIG. 3.
Figure 5:
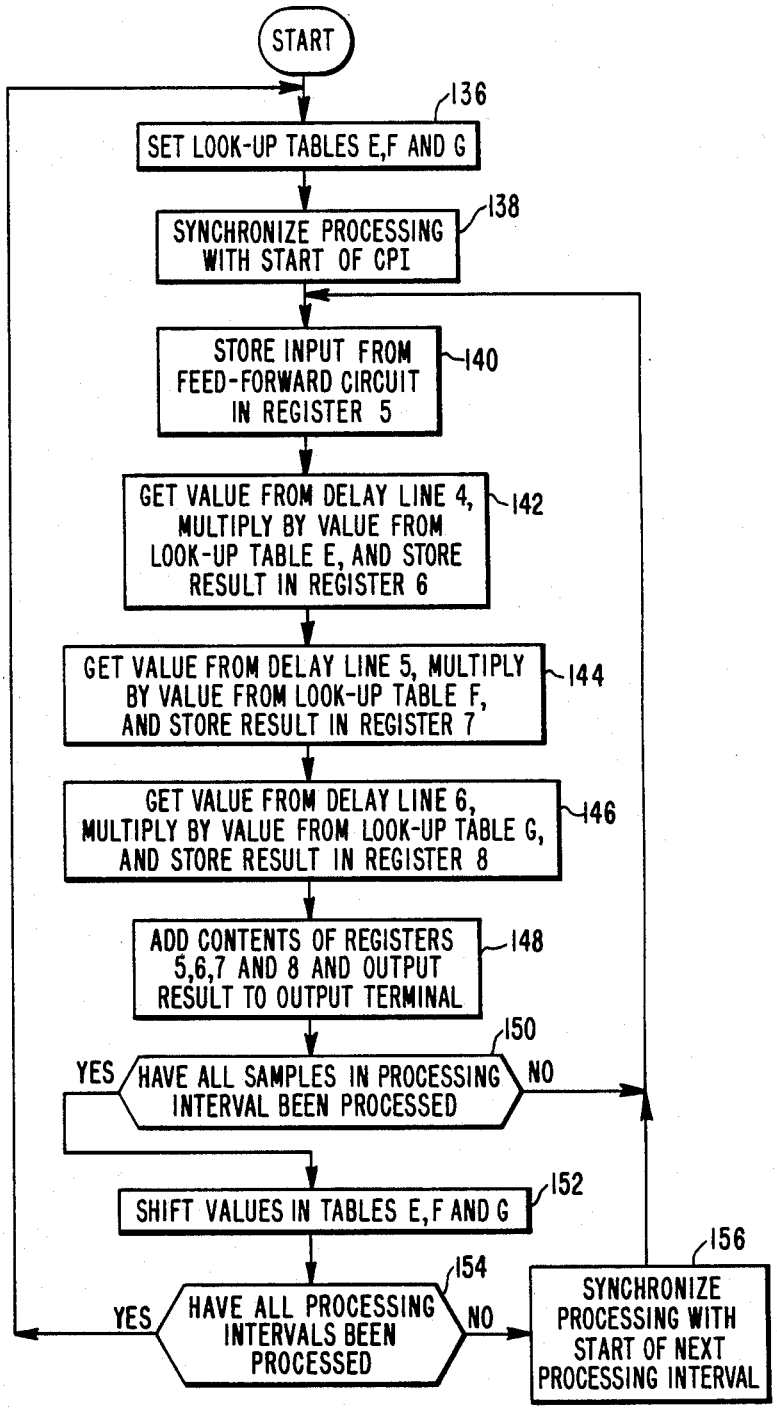
FIG. 5 is a flow chart of a procedure which may be used to perform the feedback portion of the circuit shown in FIG. 3.

The flow charts illustrated in FIGS. 4 and 5 show algorithms which may be used in a digital implementation of the invention. FIG. 4 corresponds to the feed-forward portion of the circuit shown in FIG. 3, and FIG. 5 corresponds to the feedback portion of the circuit shown in FIG. 3. According to block 114 shown in FIG. 4, the four look-up tables A, B, C and D are first set so that they will start yielding values or weights corresponding to the circuit amplification values. As previously indicated, some of the "amplifier" values are zero to block the pulse and some values are negative.

The beginning of the filter processing is synchronized with the transmitted radar pulses so that the filter is processing the pulses in a CPI successively and with a known and predetermined pattern of amplifier gain values or multiplier weights. Thus, according to block 116, this specific digital processing technique synchronizes the starting of the steps which follow with the beginning of the CPI.

The first step of processing the digital samples in a CPI, as stated in block 118, is to get the current sample value, multiply it by the values stored in look-up table A for this position and pulse, and store the result in register 1. In effect, this provides the function of the amplifier 88 shown in FIG. 3. Other functions of the digital embodiment shown in FIGS. 4 and 5 and the corresponding analog components shown in FIGS. 3 should be obvious by referring to the circuit shown in FIG. 3 along with the description of operation of the digital embodiments.

Delay lines are used by the digital embodiments of FIGS. 4 and 5 to delay the availability of digital sample values until a later point in time or, stated another way, to save current sample values for use later. The feed-forward portion of the filter uses three digital delay lines functionally connected in series. These progressively delay the digital input signal samples for use by the other amplifiers (analog embodiment) or multiplication operations (digital embodiment). In general, these digital delay lines provide a means for storing the digital sample values until they are needed, with the delay line providing the values in the order received, or on a first-in, first-out basis.

Delay line 1 provides a delayed sample value to be multiplied by the appropriate value from look-up table B, as stated in block 120. The result is stored in register 2. Similarly, blocks 122 and 124 indicate that, according to this digital embodiment, a value from delay line 2 is multiplied by a value from table C, and a value from delay line 3 is multiplied by a value from table D, with the results stored in registers 3 and 4, respectively.

After loading the registers with the amplified or "conditioned" values (defined previously), registers 1, 2, 3 and 4 are added together to, as stated in block 126, provide the signal from the feed-forward portion of the circuit. This will be used later by the feedback portion of the circuit. Blocks 128, 130, 132 and 134 complete the steps in the feed-forward digital embodiment.

If all of the digital samples available during the first processing interval have not been processed, as would normally be the case on the first passage through the flow diagram, the processor loops back to block 118 for further sample processing. Once all of the samples have been processed (delayed, weighted, and added), the processor proceeds to block 130 and shifts the values in the look-up tables. This sets the values for processing of the next processing interval which corresponds, so far, to the period of time between the second and third pulses of the CPI. Shifting of the look-up table values for the next loop through the flow chart can be accomplished by changing a pointer which is used to go into the table to obtain the values. Shifting could also be accomplished by moving the next value to the top of the table, by bringing in from memory a new block of data to the table, or by other conventional means for manipulating a look-up table to get desired values.

After the look-up tables have been shifted, the processor determines if all of the processing intervals have been processed. If not, block 134 indicates that the processor goes to process the samples in the next processing interval with the new table multiplication values and that the timing is synchronized such that the operations stated in block 118 coincide with the beginning of that processing interval. If all of the processing intervals of the CPI have been processed as determined at block 132, the processor returns to the beginning to process the next CPI with the table values returned to their original starting values. Clearing of the delay lines would also be needed to eliminate data from the previous CPI.

FIG. 5 illustrates the digital embodiment of the feedback portion of the circuit shown in FIG. 3. With few exceptions, the operations indicated by blocks 136 through 156 are similar to the operations described in connection with FIG. 4. As shown in block 140, the value obtained from the feed-forward section is used as one of the values stored in the registers. The other register values are obtained from delay lines 4, 5 and 6 after multiplication by values from look-up tables E, F and G. The output of the adding operation stated in block 148 is applied to the output terminal of the circuit (terminal 112 in FIG. 3). The net result of the processing shown in FIG. 5 being that varying portions of both the present and delayed values of the output signal are fed back into the adder to provide the feedback afforded by this section of the circuit.

Figure 6:
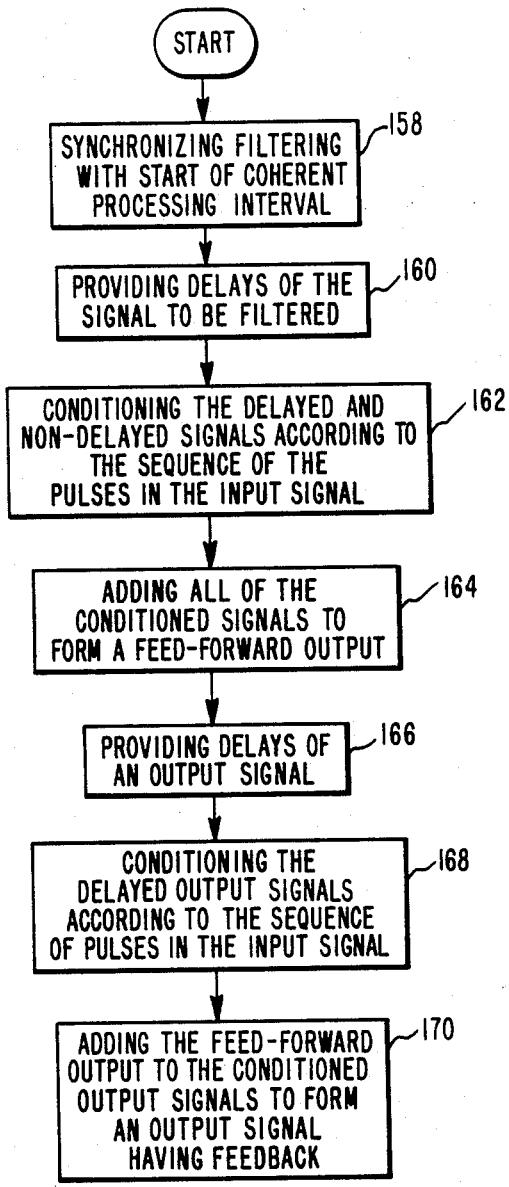
FIG. 6 is a listing of the steps included in the method of filtering accomplished by the circuit shown in FIG. 3.

FIG. 6 iilustrates the steps used by the circuit of FIG. 3 or the processor of FIGS. 4 and 5 to filter the pulse signal. As shown in block 158, one step in the function of the filter is to synchronize the beginning of filtering with the start of a coherent processing interval. This is necessary in order that the weights or multipliers can be set according to the pulse number in the CPI. As shown in block, 160, the input signal is delayed for latter retrieval and use. The delayed signals are conditioned (amplified, blocked, inverted, etc.) along with the non-delayed input signal, as stated in block 162. The conditioning is dependent upon the number of the pulse in the input signal. Once conditioned, the non-delayed and delayed signals are added together to produce the output of the feed-forward section, as block 164 shows.

Blocks 166, 168 and 170 indicate that the output signal of the filter is delayed, conditioned according to the pulse number, and added to the signal from the feed-forward portion of the circuit. This arrangement of adding the output signals provides the feedback present in the output after enough pulses have progressed through the output delays to influence the result of the adder.

It is emphasized that since numerous changes may be made in the above-described filter and since different embodiments of the invention may be made without departing from the spirit thereof, it is intended that all of the matter contained in the foregoing description or shown in the accompanying drawing shall be interpreted as illustrative rather than limiting. Although the invention is, in some places, described and claimed in terms of discrete elements such as amplifiers, delay circuits and adders, it is understood that these elements may be functionally provided by digital processing techniques without deviating from the claimed invention.

I claim as my invention:

1. A filter suitable for processing a repetitive string of pulses, said filter comprising:
   first means for adding together at least two signals;
   means for transferring an input pulse to said first adding means through a first path;
   first means for amplifying a signal, said first amplifying means being positioned in said first path;
   means for transferring an input signal to said first adding means through a second path;
   second means for amplifying a signal, said second amplifying means being positioned in said second path;
   first delay means positioned in said second path to delay the application of an input signal to said second amplifying means;
   second means for adding together at least two input signals;
   connection means for providing a third path between said first and second adder means;
   first means for controlling the amplitude of the signal in said third path;
   means for transferring the output of said second adding means through a fourth path back to an input of said second adding means;
   second delay means positioned in said fourth path to delay signals through said fourth path;
   third means for amplifying a signal, said third amplifying means being positioned in said fourth path; and
   second means for controlling the amplitude of the signal at the output of said second adding means; and
   wherein the means for controlling the amplitude of the signal in said third path includes:
   fourth means for amplifying a signal, said fourth amplifying means being positioned in said third path; and
   means for controlling the gain of said fourth amplifying means.

2. A filter suitable for processing a repetitive string of pulses, said filter comprising:
   first mean for adding together at least two signals;
   means for transferring an input pulse to said first adding means through a first path;
   first means for amplifying a signal, said first amplifying means being positioned in said first path;
   means for transferring an input signal to said first adding means through a second path;
   second means for amplifying a signal, said second amplifying means being positioned in said second path;
   first delay means positioned in said second path to delay the application of an input signal to said second amplifying means;
   second means for adding together at least two input signals;
   connection means for providing a third path between said first and second adder means;
   first means for controlling the amplitude of the signal in said third path;
   means for transferring the output of said second adding means through a fourth path path to an input of said second adding means;
   second delay means positioned in said fourth path to delay signals through said fourth path;
   third means for amplifying a signal, said third amplifying means being positioned in said fourth path; and
   second means for controlling the amplitude of the signal at the output of said second adding means;
   wherein the first means for controlling the amplitude of the signal in said third path includes means for controlling the gain of the first and second amplifying means.

3. The filter of claim 1 wherein the means for controlling the amplitude of the signal at the output of the second adding means includes:
   fifth means for amplifying the output of the second adder; and
   means for controlling the gain of said fifth amplifying means.

4. The filter of claim 2 wherein the means for controlling the amplitude of the signal at the output of the second adding means includes means for controlling the gain of the third amplifying means.

5. The filter of claim 1 wherein the first and second delay means delay the signals therethrough for a period of time substantially equal to the interpulse period of the repetitive string of pulses applied to the filter.

6. The filter of claim 1 wherein the means for controlling the amplitude of the signal in the third path maintains a substantially zero amplitude in the third path during the first pulse applied to the filter.

7. The filter of claim 1 including one or more additional feed-forward paths with each feed-forward path containing delay means and amplifying means, and wherein the first adding means includes one or more additional input channels to which said additional feed-forward paths are connected.

8. The filter of claim 1 including one or more additional feedback paths with each feedback path containing delay means and amplifying means, and wherein the second adding means includes one or more additional input channels to which said additional feedback paths are connected.

9. The filter of claim 1 wherein the means for controlling the amplitude of the fourth amplifying means increases the gain of the fourth amplifying means on each successive pulse after the first non-zero gain is provided.

10. The filter of claim 3 wherein the means for controlling the amplitude of the fifth amplifying means decreases the gain of the fifth amplifying means on each successive pulse after the first non-zero gain is provided.

11. A filter suitable for processing a repetitive string of pulses, said filter comprising:
    signal input and output terminals;

first and second means for adding a plurality of input signals;

a first amplifier connected between said input terminal and an input of said first adding means;

first, second and third delay means connected in series with the input of the first delay means being connected to said input terminal;

a second amplifier having its input connected to the junction between said first and second delay means and its output to said first adder;

a third amplifier having its input connected to the junction between said second and third delay means and its output to said first adder;

a fourth amplifier having its input connected to the output of said third delay means and its output to said first adder;

fourth, fifth and sixth delay means connected in series with the input of said fourth delay means being connected to said output terminal;

a fifth amplifier having its input connected to the junction between said fourth and fifth delay means and its output to said second adder;

a sixth amplifier having its input connected to the junction between said fifth and sixth delay means and its output to said second adder;

a seventh amplifier having its input connected to the output of said sixth delay means and its output to said second adder;

first means for controlling the gain of said first, second, third and fourth amplifiers depending upon which pulse of the repetitive string of pulses is being processed; and second means for controlling the gain of said fifth, sixth and seventh amplifiers depending upon which pulse of the repetitive string of pulses is being processed;

each of said delay means having a delay equal to the interpulse period of the repetitive pulse string applied to the filter.

12. The filter of claim 11 wherein the second and fourth amplifiers have inverted outputs.

13. The filter of claim 11 wherein the first controlling means maintains the gain of the first, second, third and fourth amplifiers in such a manner as to make the output signal from the first adder equal to zero during the first three input pulses.

14. A method of filtering radar signal echoes resulting from the transmission of a batch of radar pulses, said method comprising the steps of:

synchronizing the start of filtering with the beginning of the pulse batch;

providing a plurality of delays of the signal to be filtered;

conditioning the delayed and non-delayed signals according to the sequence of the pulses in the transmitted batch;

adding the conditioned signals to form a feed-forward output;

providing a plurality of delays for the feed-forward output signal;

conditioning the delayed feed-forward output signals according to the sequence of the pulses in the transmitted batch; and adding the current feed-forward output to the delayed and conditioned feed-forward output signals.

15. The method of filtering of claim 14 wherein each of the delays provided for the signal to be filtered and for the output signal have a duration equal to the interpulse period of the radar pulses.

* * * * *